United States Patent
Yamaguchi et al.

(10) Patent No.: US 8,766,423 B2
(45) Date of Patent: Jul. 1, 2014

(54) SEMICONDUCTOR DEVICE AND STACKED SEMICONDUCTOR DEVICE

(76) Inventors: Masahiro Yamaguchi, Tokyo (JP); Hiroaki Ikeda, Tokyo (JP)

(*) Notice: Subject to any disclaimer, the term of this patent is extended or adjusted under 35 U.S.C. 154(b) by 180 days.

(21) Appl. No.: 13/355,713

(22) Filed: Jan. 23, 2012

(65) Prior Publication Data

US 2012/0187402 A1  Jul. 26, 2012

(30) Foreign Application Priority Data

Jan. 26, 2011  (JP) ................................ P2011-014423

(51) Int. Cl.
*H01L 23/02* (2006.01)

(52) U.S. Cl.
USPC ...... 257/686; 257/48; 257/774; 257/E23.067; 257/E23.085

(58) Field of Classification Search
USPC ............ 257/48, 686, 774, E23.067, E23.085
See application file for complete search history.

(56) References Cited

U.S. PATENT DOCUMENTS

| | | | |
|---|---|---|---|
| 6,608,371 B2 * | 8/2003 | Kurashima et al. | 257/686 |
| 7,911,048 B2 * | 3/2011 | Murayama | 257/693 |
| 7,973,414 B2 * | 7/2011 | Suh | 257/774 |
| 2007/0007639 A1 | 1/2007 | Fukazawa | |
| 2008/0299768 A1 * | 12/2008 | Yamano | 438/667 |

FOREIGN PATENT DOCUMENTS

JP    2007-036184 A    2/2007

* cited by examiner

*Primary Examiner* — Andy Huynh
(74) *Attorney, Agent, or Firm* — McGinn IP Law Group, PLLC (57) ABSTRACT

A semiconductor device includes a semiconductor chip having first and second surfaces. A first through electrode extends through the semiconductor chip. A first surface electrode is positioned on the first surface of the semiconductor chip and coupled to a first end of the first through electrode. A second surface electrode is positioned on the second surface of the semiconductor chip. The second surface electrode is coupled to a second end of the first through electrode. A second through electrode extends through the semiconductor chip and has third and fourth ends. A third surface electrode is positioned on the second surface of the semiconductor chip and is coupled to the fourth end of the second through electrode. The semiconductor device is free of a surface electrode on the first surface of the semiconductor chip and is coupled to the third end of the second through electrode.

20 Claims, 6 Drawing Sheets

FIG. 7

SEMICONDUCTOR DEVICE AND STACKED SEMICONDUCTOR DEVICE

BACKGROUND OF THE INVENTION

1. Field of the Invention

The present invention generally relates to a semiconductor device and a stacked semiconductor device as well as methods of forming the same.

Priority is claimed on Japanese Patent Application No. 2011-014423, filed Jan. 26, 2011, the content of which is incorporated herein by reference.

2. Description of the Related Art

Japanese Patent Application Publication No. JPA 2007-36184 discloses a stacked semiconductor device, in which a plurality of semiconductor devices (semiconductor chips having through electrodes) are stacked on a circuit board and in which, by electrically connecting the plurality of semiconductor device via the through electrodes, it is possible to achieve high packaging density of the semiconductor chips on to the circuit board.

In the case of performing a semiconductor chip test before mounting to the circuit board, it is desired to cause probe needles to come into direct contact with the ends of the through electrodes. The result is that the ends of the through electrodes which are contacted by the probe needles are damaged. For this reason, imperfect connections can be caused between through electrodes that make connections between adjacent semiconductor devices when the semiconductor devices are stacked.

SUMMARY

In one embodiment, a semiconductor device may include, but is not limited to, a semiconductor chip having first and second surfaces; a first through electrode that extends through the semiconductor chip; a first surface electrode positioned on the first surface of the semiconductor chip, the first surface electrode being coupled to a first end of the first through electrode; a second surface electrode positioned on the second surface of the semiconductor chip, the second surface electrode being coupled to a second end of the first through electrode; a second through electrode that extends through the semiconductor chip, the second through electrode having third and fourth ends; and a third surface electrode positioned on the second surface of the semiconductor chip, the third surface electrode being coupled to the fourth end of the second through electrode. The semiconductor device is free of a surface electrode on the first surface of the semiconductor chip, the surface electrode being coupled to the third end of the second through electrode.

In another embodiment, a semiconductor device may include, but is not limited to, a semiconductor chip having first and second surfaces; a plurality of first through electrodes that extends through the semiconductor chip; a plurality of first surface electrodes positioned on the first surface of the semiconductor chip, each of the first surface electrodes being coupled to a first end of a corresponding one of the first through electrodes; a plurality of second surface electrodes positioned on the second surface of the semiconductor chip, each of the second surface electrodes coupled to a second end of a corresponding one of the first through electrodes; a plurality of second through electrodes that extend through the semiconductor chip, each of the second through electrodes having third and fourth ends; and a plurality of third surface electrodes positioned on the second surface of the semiconductor chip, each of the third surface electrodes being coupled to the fourth end of a corresponding one of the second through electrodes; and an insulator that covers the third ends of the second through electrodes.

In still another embodiment, a semiconductor device may include, but is not limited to, a package substrate; and a stack of semiconductor chips over the package substrate, each of the semiconductor chips having first and second surfaces. Each of the semiconductor chips may include, but is not limited to, a first through electrode that extends through each of the semiconductor chips; a first surface electrode positioned on the first surface of each of the semiconductor chips, the first surface electrode being coupled to a first end of the first through electrode; a second surface electrode positioned on the second surface of each of the semiconductor chips, the second surface electrode being coupled to a second end of the first through electrode; a second through electrode that extends through each of the semiconductor chips, the second through electrode having third and fourth ends; and a third surface electrode positioned on the second surface of the first semiconductor chip, the third surface electrode coupled to the fourth end of the second through electrode. The first through electrodes of the semiconductor chips included in the stack are connected to each other via the first and second surface electrodes, and the second through electrodes of the semiconductor chips included in the stack are electrically separated from each other.

BRIEF DESCRIPTION OF THE DRAWINGS

The above features and advantages of the present invention will be more apparent from the following description of certain preferred embodiments taken in conjunction with the accompanying drawings, in which.

DETAILED DESCRIPTION OF THE PREFERRED EMBODIMENTS

Embodiments of the invention will be now described herein with reference to illustrative embodiments. Those skilled in the art will recognize that many alternative embodiments can be accomplished using the teaching of the embodiments of the present invention and that the invention is not limited to the embodiments illustrated for explanatory purpose.

In one embodiment, a semiconductor device may include, but is not limited to, a semiconductor chip having first and second surfaces; a first through electrode that extends through the semiconductor chip; a first surface electrode positioned on the first surface of the semiconductor chip, the first surface electrode being coupled to a first end of the first through electrode; a second surface electrode positioned on the second surface of the semiconductor chip, the second surface electrode being coupled to a second end of the first through electrode; a second through electrode that extends through the semiconductor chip, the second through electrode having third and fourth ends; and a third surface electrode positioned on the second surface of the semiconductor chip, the third surface electrode being coupled to the fourth end of the second through electrode. The semiconductor device is free of a surface electrode on the first surface of the semiconductor chip, the surface electrode being coupled to the third end of the second through electrode.

In some cases, the semiconductor device may further include, but is not limited to, an insulator that covers the third end of the second through electrode.

In some cases, the semiconductor device may further include, but is not limited to, an insulating film which covers the first surface of the semiconductor chip. The insulating film has a first opening through which the first surface electrode is coupled to the first end of the first through electrode. The insulating film covers the third end of the second through electrode.

In some cases, the semiconductor chip may include, but is not limited to, a semiconductor substrate; and a multilevel interconnect structure over the semiconductor substrate. The first through electrode may include, but is not limited to, a first portion penetrating the semiconductor substrate, and a second portion extending through the multilevel interconnect structure and being connected to the first portion. The second through electrode may include, but is not limited to, a third portion penetrating the semiconductor substrate, and a fourth portion extending through the multilevel interconnect structure and being connected to the third portion.

In some cases, the first and third portions may include, but is not limited to, copper. The second and fourth portions are made of a conductor which is different from copper.

In some cases, the third surface electrode is greater in surface area than the second surface electrode.

In some cases, the semiconductor chip has a normal operation mode and a test mode. The semiconductor chip is configured to transfer signals through the second through electrode in the test mode. The semiconductor chip is configured not to transfer signals through the second through electrode in the normal operation mode.

In some cases, the semiconductor chip may further include, but is not limited to, a test circuit electrically coupled to the second through electrode.

In another embodiment, a semiconductor device may include, but is not limited to, a semiconductor chip having first and second surfaces; a plurality of first through electrodes that extends through the semiconductor chip; a plurality of first surface electrodes positioned on the first surface of the semiconductor chip, each of the first surface electrodes being coupled to a first end of a corresponding one of the first through electrodes; a plurality of second surface electrodes positioned on the second surface of the semiconductor chip, each of the second surface electrodes coupled to a second end of a corresponding one of the first through electrodes; a plurality of second through electrodes that extend through the semiconductor chip, each of the second through electrodes having third and fourth ends; and a plurality of third surface electrodes positioned on the second surface of the semiconductor chip, each of the third surface electrodes being coupled to the fourth end of a corresponding one of the second through electrodes; and an insulator that covers the third ends of the second through electrodes.

In some cases, the insulator may include, but is not limited to, an insulating film which covers the first surface of the semiconductor chip. The insulating film has a plurality of first openings. Each of the first surface electrodes is coupled through a corresponding one of the plurality of first openings to the first end of the corresponding corresponding one of the first through electrodes. The insulating film covers the third ends of the second through electrodes.

In still another embodiment, a semiconductor device may include, but is not limited to, a package substrate; and a stack of semiconductor chips over the package substrate, each of the semiconductor chips having first and second surfaces. Each of the semiconductor chips may include, but is not limited to, a first through electrode that extends through each of the semiconductor chips; a first surface electrode positioned on the first surface of each of the semiconductor chips, the first surface electrode being coupled to a first end of the first through electrode; a second surface electrode positioned on the second surface of each of the semiconductor chips, the second surface electrode being coupled to a second end of the first through electrode; a second through electrode that extends through each of the semiconductor chips, the second through electrode having third and fourth ends; and a third surface electrode positioned on the second surface of the first semiconductor chip, the third surface electrode coupled to the fourth end of the second through electrode. The first through electrodes of the semiconductor chips included in the stack are connected to each other via the first and second surface electrodes, and the second through electrodes of the semiconductor chips included in the stack are electrically separated from each other.

In some cases, each of the semiconductor chips may further include, but is not limited to, an insulator that covers the third end of the second through electrode.

In some cases, each of the semiconductor chips may further include, but is not limited to, an insulating film which covers the first surface of the first semiconductor chip. The insulating film has a first opening through which the first surface electrode is coupled to the first end of the first through electrode. The insulating film covers the third end of the second through electrode.

In some cases, each of the semiconductor chips may further include, but is not limited to, a semiconductor substrate; a multilevel interconnect structure over the semiconductor substrate; and an insulating film over the multilevel interconnect structure. The first through electrode may further include, but is not limited to, first and second portions, the first portion penetrating the semiconductor substrate, and the second portion having a fifth end which is connected to the first portion and a sixth end which is connected to the first surface electrode, and the second portion extending through the multilevel interconnect structure. The second through electrode may include, but is not limited to, third and fourth portions. The third portion penetrates the semiconductor substrate. The fourth portion has a seventh end which is connected to the third portion and an eighth end which is covered with the insulating film. The fourth portion extends through the multilevel interconnect structure.

In some cases, the first and third portions may include, but is not limited to, copper. The second and fourth portions are made of a conductor which is different from copper.

In some cases, the third surface electrode is greater in surface area than the second surface electrode.

In some cases, each of the semiconductor chips has a normal operation mode and a test mode. Each of the semiconductor chips is configured to transfer signals through the second through electrode in the test mode. Each of the first semiconductor chips is configured not to transfer signals through the second through electrode in the normal operation mode.

In some cases, each of the semiconductor chips may further include, but is not limited to, a test circuit electrically coupled to the second through electrode.

Embodiment

Figure 1:
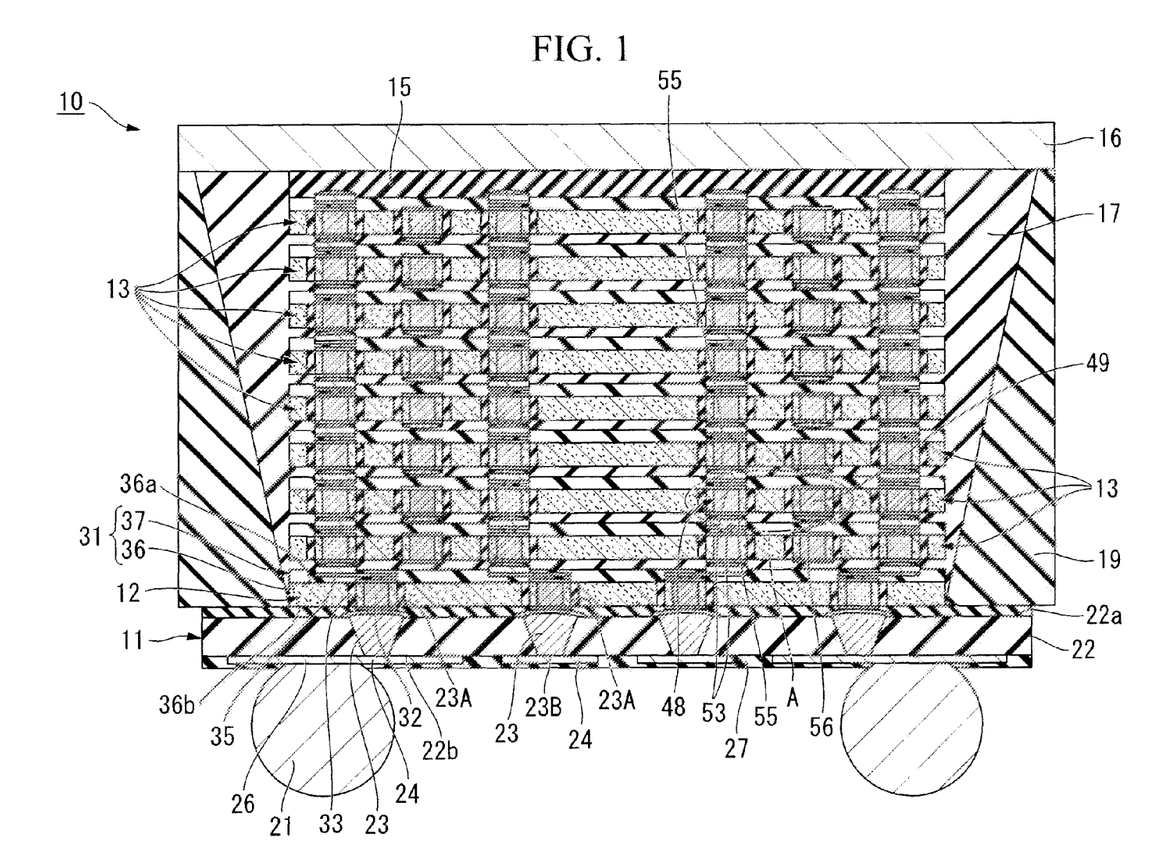
FIG. 1 is a cross sectional elevation view of a semiconductor package including a stack of semiconductor chips in accordance with one or more embodiments of the present invention.

FIG. 1 is a cross-sectional view showing the general constitution of a stacked semiconductor device according to an embodiment of the present invention.

Referring to FIG. 1, the stacked semiconductor device 10 of the present embodiment has a package board 11, an interface semiconductor device 12, a plurality of semiconductor devices 13 (eight semiconductor devices 13 in the case of the present embodiment), a non-conductive film 15, a lead frame 16, an underfilling resin 17, a sealing resin 19, and external terminals 21.

The package board 11 has a main board 22, through-hole electrodes 23, an interconnect layer 24, land parts 26, and solder resist 27. The main board 22 is a flat board. An insulating resin board can be used as the main board 22.

The through-hole electrodes 23 are made of a metallic material, and are provided so as to pass through the main board 22. One end 23A of a through-hole electrode 23 is exposed from the surface 22a of the main board 22. The other end 23B of the through-hole electrode 23 (the end of the through-hole electrode 23 positioned on the other side from the one end 23A) is exposed from the rear surface 22b of the main board 22 and is also substantially flush with respect to the rear surface 22b of the main board 22.

The interconnect layer 24 is provided on the rear surface 22b of the main board 22 so as to make contact with the other end 23B of the through hole electrode 23. The interconnect layer 4 is a reconnection, and is an interconnect layer for the purpose of widening the placement pitch oft the external terminals 21.

The land parts 26 are provided on the rear surface 22b of the main board 22. The land parts 26 are constituted integrally with the interconnect layer 24, and are conductors which the external terminals 21 are connected.

The package board 11 constituted as noted above is electrically connected to a mother hoard (not shown) via the external terminals 21.

The solder resist 27 is provided on the rear surface 22b of the main board 22 so as to cover the interconnect layer 24. The solder resist 27 has aperture parts (not shown) that expose the land parts 26.

The interface semiconductor device 12 has a semiconductor chip 31, through electrodes 32, insulating rings 33, and electrode pads 35.

The semiconductor chip 31 has a semiconductor substrate 36, and a multilayer interconnect structure 37 that includes a circuit layer. The semiconductor substrate 36 is planar and is, for example, a silicon substrate.

The multilayer interconnect structure 37 is provided on the upper surface 36a of the semiconductor substrate 36. The multilayer interconnect structure 37 is constituted by a plurality of laminated insulating layers, and a plurality of interconnects and contact plugs that are foamed on the plurality of insulating layers.

The through electrode 32 is multiply provided so as to pass through the semiconductor substrate 36. One end of a through electrode 32, which is positioned on the rear surface 36b side of the semiconductor substrate 36, is connected via solder to one end 23A of a through electrode 23 provided on the package board 11.

The insulating rings 33 are provided so as to pass through the semiconductor substrate 36 at a position in the periphery of the through electrodes 32. An insulating ring 33 is disposed so as to surround the periphery of a through electrode 32, with the semiconductor substrate 36 intervening therebetween.

The electrode pads 35 are provided on the multilayer interconnect structure 37, and are electrically connected to the interconnects and the contact plugs constituting the multilayer interconnect structure 37. The electrode pads 35 are electrically connected to an interface circuit (not shown) formed on the semiconductor substrate 36, via a plurality of interconnects and contact plugs constituting the multilayer interconnect structure 37.

The interface semiconductor device 12 constituted as noted above is mounted to the surface side of the package board 11 (the front surface 22a side of the main board 22). The interface semiconductor device 12 performs exchange of information between the plurality of semiconductor device 13 stacked on the interface semiconductor device 12 and the package board 11.

The plurality of semiconductor devices 13 (eight semiconductor devices 13 in the case of the present embodiment) are stacked onto the interface semiconductor device 12, and are electrically connected to the interface semiconductor device 12. The plurality of semiconductor devices 13 are electrically connected to the package board 11 via the interface semiconductor device 12.

A semiconductor memory or other semiconductor chip can be uses as a semiconductor device 13. For example, a DRAM (dynamic random-access memory), an SRAM (static random-access memory), a PRAM (phase-change RAM), a flash memory or the like can be used as the semiconductor memory.

The specific constitution of the semiconductor device 13 will be described with reference to FIG. 2, which is described later.

The non-conductive Film 15 is a non-conductive film (NCF) that is disposed so as to cover the upper surface of the semiconductors device 13 that are stacked at the uppermost layer of the stacked semiconductor devices 13.

The lead frame 16 is a constituted of a metallic material, and is disposed over the non-conductive film 15. The shape of the lead frame 16 has a width that is greater than that of the semiconductor devices 13.

The underfilling resin 17 is provided so as to cover between the interface semiconductor device 12 and the semiconductor device 13 and between the semiconductor devices 13, and so as to cover the side surfaces of the stacked plurality of semiconductor devices 13.

The sealing resin 19 is provided between the package board 11 and the lead frame 16, so as to surround the periphery of the underfilling resin 17. The sealing resin 19 seals the interface semiconductor device 12 and the plurality of semiconductor devices 13 with the underfilling resin 17 therebetween.

The external terminals 21 are disposed on land parts 26 provided on the package board 11. By doing this, the external terminals 21 are electrically connected to the interface semiconductor device 12 and the plurality of semiconductor devices 13, via the package board 11. Solder balls, for example, can be used as the external terminals 21.

Figure 2:
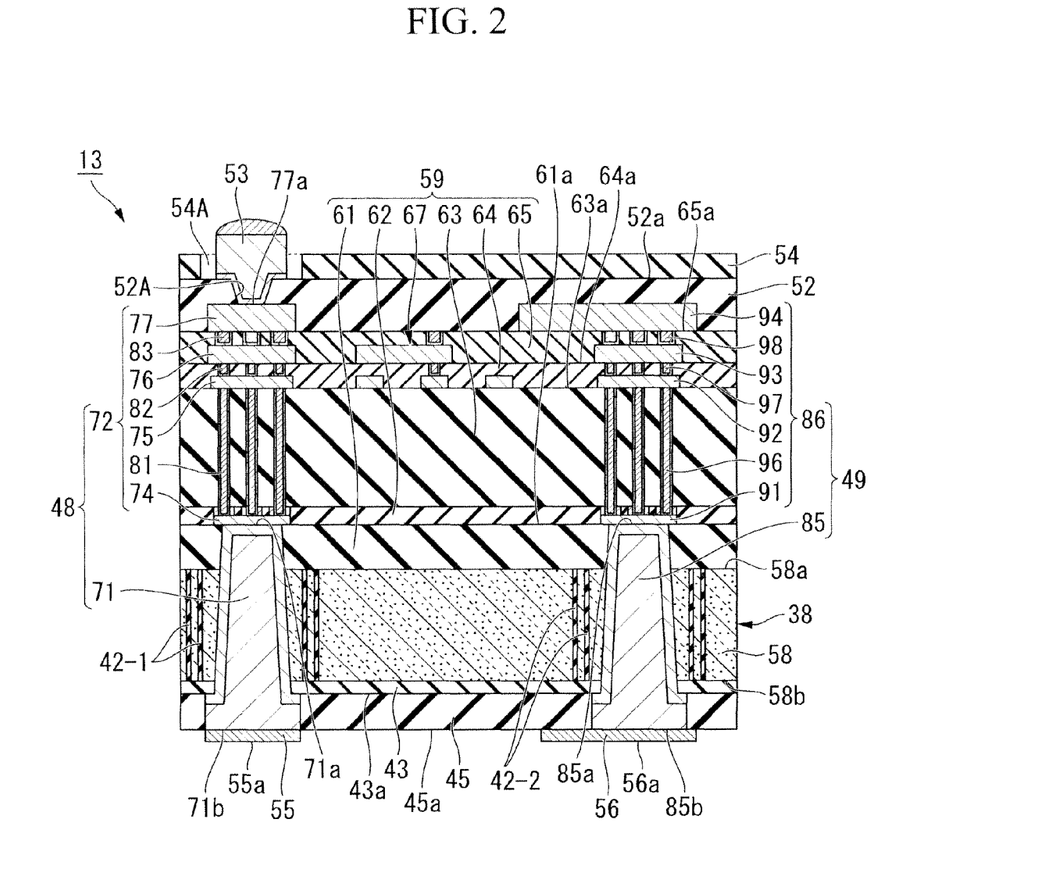
FIG. 2 is a fragmentary enlarged cross sectional elevation view of a semiconductor device, encompassed by a double-bot-and-broken line of A in FIG. 1, included in the semiconductor package of FIG. 1.

FIG. 2 is an enlarged cross-sectional view of the region of the semiconductor device surrounded and marked A in FIG. 1.

Referring to FIG. 2, a semiconductor device 13 has a semiconductor chip 38, insulating rings 42-1 and 42-2, a first insulating film 43, a second insulating film 45, a first through electrode 48, a second through electrode 49, a third insulating film 52, a first front-surface electrode 53, a protective film 54, a first rear-surface electrode 55, and a second rear-surface electrode 56.

Referring to FIG. 2, the semiconductor chip 38 has a semiconductor substrate 58 and a multilayer interconnect structure 59. The semiconductor substrate 58 is planar, and has a front surface 58a and a rear surface 58b.

In the case of the present embodiment, the front surface of the semiconductor chip 38 is the upper surface of the multilayer interconnect structure 59 (the upper surface (upper surface 65a) of the fifth interlayer insulating film 65).

The rear surface of the semiconductor chip 38 is the lower surface of the multilayer interconnect structure 59 (specifically, the lower surface 58b of the semiconductor substrate 58). A silicon substrate, for example, can be used as the semiconductor substrate 58.

Referring to FIG. 2, the multilayer interconnect structure 59 has first to fifth interlayer insulating films 61 to 65 and an interconnect pattern 67. The first to fifth interlayer insulating films 61 to 65 are laminated onto the front surface 58a of the semiconductor substrate 58 in the sequence of the first interlayer insulating film 61, the second interlayer insulating film 62, the third interlayer insulating film 63, the fourth interlayer insulating film 64, and then the fifth interlayer insulating film 65.

Referring to FIG. 2, the interconnect pattern 67 is constituted by a plurality of interconnects and through-hole electrodes, and a plurality of the interconnect patterns 67 are provided within the laminated first to fifth interlayer insulating films 61 to 65. The interconnect pattern 67 is electrically connected to the first to fourth interconnect pads 74 to 77, to be described later, which constitute the first through electrode 48, and to the first to fourth interconnect pads 91 to 94, to be described later, which constitute the second through electrode 49. A plurality of interconnect patterns 67 are conductors for transferring a plurality of signals and power supplies.

Although not shown in FIG. 2, a test circuit (the test circuit 101 shown in FIG. 5 and described later), an address buffer (address buffer 102 shown FIG. 5), a command decoder (command decoder 103 shown in FIG. 5), an internal circuit, a row decoder (row decoder 104 shown in FIG. 5), a column decoder (column decoder 105 shown in FIG. 5), and a memory cell array 106 and the like are formed on the front surface 58a side of the semiconductor substrate 58.

Referring to FIG. 2, the insulating rings 42-1 and 42-2 are provided so as to pass through the semiconductor substrate 58. The insulating rings 42-1 and 42-2 have double structures. Stated differently, each of the insulating rings 42-1 and 42-2 is constituted by two insulating rings.

The insulating ring 42-1 is disposed so as to surround the first through electrode 48 (specifically, the first substrate through electrode 71, which is the first part, to be described later). The insulating ring 42-2 is disposed so as to surround the second through electrode 49 (specifically, the second substrate through electrode 85, which is the third part, to be described later). The insulating rings 42-1 and 42-2 have the function of reducing the electrostatic capacitance between the semiconductor substrate 58 and the first and second substrate through electrodes 71, 85.

Referring to FIG. 2, the first insulating film 43 is provided so as to cover the rear-surface 58b of the semiconductor substrate 58. The second insulating film 45 is provided on the lower surface 43a of the first insulating film 43.

Referring to FIG. 2, the first through electrode 48 has a first substrate through electrode 71, which is the first part, and a first interconnect structure 72, which is the second part.

Referring to FIG. 2, the first substrate through electrode 71 is provided so as to pass through the part of the semiconductor substrate 58 that is surrounded by the insulating ring 42-1 and also to pass through the first and second insulating films 43, 45 and the first interlayer insulating film 61.

One end 71a of the first substrate through electrode 71 (the end exposed from the first interlayer insulating film 61) positioned on the front-surface 58a side of the semiconductor substrate 58 is made a planar surface, and is made substantially flush with respect to the upper surface 61a of the first interlayer insulating film 61. The one end 71a of the first substrate through electrode 71 is connected to the first pad 74 of the first interconnect structure 72. By doing this, the first substrate through electrode 71 is electrically connected to the first interconnect structure 72.

One end 71b of the first substrate through electrode 71 positioned on the rear surface 59a of the semiconductor substrate 58 is made a planar surface exposed from the second insulating film 45, and this planar surface is made substantially flush with respect to the lower surface 45a of the second insulating film 45. Copper is used as the material of the first substrate through electrode 71.

Referring to FIG. 2, the first interconnect structure 72 has first to fourth interconnect pads 74 to 77, and first to third through-hole electrodes 81 to 83.

The first interconnect pad 74 (one end of the first interconnect structure 72) is provided on the upper surface 61a of the first interlayer insulating film 61, so that it makes contact with the entire one end 71a of the first substrate through electrode 71.

By doing this, the first interconnect pad 74 is electrically connected to the first substrate through electrode 71. The second interconnect pad 75 is provided on the upper surface 63a of the third interlayer insulating film 63 so as to oppose the first interconnect pad 74.

The third interconnect pad 76 is provided on the upper surface 64a of the third interlayer insulating film 64 so as to oppose the second interconnect pad 75. The fourth interconnect pad 77 (one end of the first interconnect structure 72) provided on the upper surface 65a of the fourth interlayer insulating film 65 so as to oppose the third interconnect pad 76. The fourth interconnect pad 77 is an interconnect pad disposed on the uppermost layer, and is exposed from the upper surface 65a of the fifth interlayer insulating film 65.

The first to fourth interconnect pads 74 to 77 constituted as noted above are constituted of a material other than copper. Specifically, the first to the fourth interconnect pads 74 to 77 can be constituted of a material such as titanium (Ti), titanium nitride (TiN), or aluminum (Al) or the like.

The first through-hole electrode 81 is disposed so as to pass through the second and third interlayer insulating films 62, 63 positioned between the first interconnect pad 74 and the second interconnect pad 75. The first through-hole electrode 81 has one end that is connected to the second interconnect pad 75 and another end that is connected to the first interconnect pad 74. By doing this, the first through-hole electrode 81 is electrically connected to the first substrate through electrode 71 and the second interconnect pad 75 via the first interconnect pad 74.

The second through-hole electrode 82 is disposed so as to pass through the fourth interlayer insulating film 64 that is positioned between the second interconnect pad 75 and the third interconnect pad 76. The second through-hole electrode 82 has one end that is connected to the third interconnect pad 76 and another end that is connected to the second interconnect pad 75. By doing this, the second through-hole electrode 82 is electrically connected to the first substrate through electrode 71 and the third interconnect pad 76 via the second interconnect pad 75.

The third through-hole electrode 83 is disposed so as to pass through the fifth interlayer insulating film 65 that is positioned between the third interconnect pad 76 and the fourth interconnect pad 77. The third through-hole electrode 83 has one end that is connected to the fourth interconnect pad 77 and another end that is connected to the third interconnect pad 76. By doing this, the third through-hole electrode 83 is electrically connected to the first substrate through electrode 71 and the fourth interconnect pad 77 via the third interconnect pad 76.

The first to third through-hole electrodes 81 to 83 constituted as noted above are constituted of a material other than copper. Specifically, the first to the third through-hole electrodes 81 to 83 can be constituted of a material such as titanium (Ti), titanium nitride (TIN), or tungsten (W) or the like.

Referring to FIG. 2, the second through electrode 49 has a second substrate through electrode 85, which is the third part, and a second interconnect structure 86, which is the second part.

Referring to FIG. 2, the second substrate through electrode 85 is provided to pass through the part of the semiconductor substrate 58 that is surrounded by the insulating ring 42-2, and also pass through the first and second insulating films 43, 45 and the first interlayer insulating film 61.

One end 85a of the second substrate through electrode 85 (the end exposed from the first interlayer insulating film 61) positioned on the front-surface 58a side of the semiconductor substrate 58 is made a planar surface, and is made substantially flush with respect to the upper surface 61a of the first interlayer insulating film 61. The one end 85a of the second substrate through electrode 85 is connected to the first pad 91 of the second interconnect structure 86. By doing this, the second substrate through electrode 85 is electrically connected to the second interconnect structure 86.

One end 85b of the second substrate through electrode 85 positioned on the rear-surface 58b side of the semiconductor substrate 58 is made a planar surface that is exposed from the second insulating film 45, and is made substantially flush with respect to the lower surface 45a of the second insulating film 45. Copper is used as the material of the second substrate through electrode 85.

Referring to FIG. 2, the second interconnect structure 86 has first to fourth interconnect pads 91 to 94, and first to third through-hole electrodes 96 to 98.

The first interconnect pad 91 (one end of the second interconnect structure 86) is provided on the upper surface 61a of the first interlayer insulating film 61, so that it makes contact with the one end 85a of the second substrate through electrode 85. By doing this, the first interconnect pad 91 is electrically connected to the second substrate through electrode 85. The first interconnect 91 is formed to have a width that is greater than that of the one end 85a of the second substrate through electrode 85.

The second interconnect pad 92 is provided on the upper surface 63a of the third interlayer insulating film 63, so as to oppose the first interconnect pad 91. The third interconnect pad 93 is provided on the upper surface 64a of the third interlayer insulating film 64, so as to oppose the second interconnect pad 92.

The fourth interconnect pad 94 (one end of the second substrate through electrode 49 positioned on the front-surface side of the semiconductor chip 38) is provided on the upper surface 65a of the fourth interlayer insulating film 65, so as to oppose the third interconnect pad 93. The fourth interconnect pad 94 is an interconnect pad disposed on the uppermost layer, and is exposed from the upper surface 65a of the fifth interlayer insulating film 65.

The first to fourth interconnect pads 91 to 94 constituted as noted above are constituted of a material other than copper. Specifically, the first to the fourth interconnect pads 91 to 94 can be constituted of a material such as titanium (Ti), titanium nitride (TiN), or aluminum (Al) or the like.

The first through-hole electrode 96 is disposed so as to pass through the second and third interlayer insulating films 62, 63 positioned between the first interconnect pad 91 and the second interconnect pad 92. The first through-hole electrode 96 has one end that is connected to the second interconnect pad 92 and another end that is connected to the first interconnect pad 91. By doing this, the first through-hole electrode 96 is electrically connected to the second substrate through electrode 85 and the second interconnect pad 92 via the first interconnect pad 91.

The second through-hole electrode 97 is disposed so as to pass through the fourth interlayer insulating film 64 positioned between the second interconnect 92 and the third interconnect pad 93. The second through-hole electrode 97 has one end that is connected to the third interconnect pad 93 and another end that is connected to the second interconnect pad 92. By doing this, the second through-hole electrode 97 is electrically connected to the second substrate through electrode 85 and the third interconnect pad 93 via the second interconnect pad 92.

The third through-hole electrode 98 is disposed so as to pass through the fifth interlayer insulating film 65 positioned between the third interconnect pad 93 and the fourth interconnect pad 94. The third through-hole electrode 98 has one end that is connected to the fourth interconnect pad 94 and another end that is connected to the third interconnect pad 93. By doing this, the third through-hole electrode 98 is electrically connected to the second substrate through electrode 85 and the fourth interconnect pad 94 via the third interconnect pad 93.

The first to third through-hole electrodes 96 to 98 constituted as noted above are constituted of a material other than copper. Specifically, the first to the third through-hole electrodes 96 to 98 can be constituted of a material such as titanium (Ti), titanium nitride (TiN), or tungsten (W) or the like.

Referring to FIG. 2, the third insulating 52 is provided on the upper surface 65a of the fifth interlayer insulating film 65, so as to cover a part of the fourth interconnect pad 77 and cover the fourth interconnect pad 94. The third insulating film 52 has an aperture part 52A that exposes a part of the upper surface 77a of the fourth interconnect pad 77 of the first through electrode 48. An SiON film, for example, can be used as the third insulating film 52.

Referring to FIG. 2, the first front-surface electrode 53 is provided on the upper surface 52a of the third insulating film 52, so as to bury the aperture part 52A. The first front-surface electrode 53 is connected to the upper surface 77a (one end of the first substrate through electrode 48 positioned on the front-surface side of the semiconductor chip 38) of the fourth interconnect pad 94. By doing this, the first front-surface electrode 53 is electrically connected to the first through electrode 48 via the fourth interconnect pad 77. As shown in FIG. 1, the first front-surface electrode 53 is an electrode that is connected to the first rear-surface electrode 55 provide in the semiconductor device 13 disposed above the first front-surface electrode 53 and, in the case of performing a test of the semiconductor device 10, is an electrode that is not made contact with by a terminal (for example, a probe needle) of an inspection apparatus.

Figure 3:
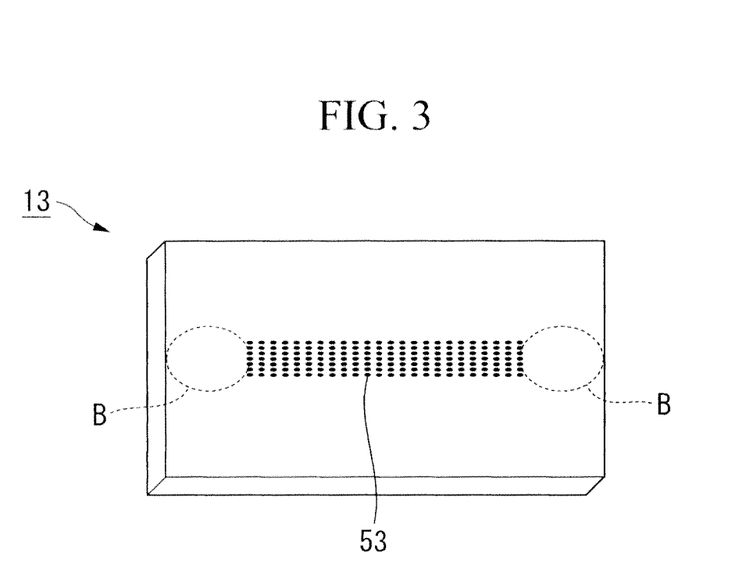
FIG. 3 is a view showing a second surface of each semiconductor chip included in the semiconductor package of FIG. 1.

FIG. 3 is an oblique view showing the rear-surface side of the semiconductor device shown in FIG. 2. In FIG. 3, B is the region for formation of the second through electrode 49 (hereinafter referred to as a second through electrode formation region B).

Referring to FIG. 3, the first front-surface electrode 53 is disposed between the second through electrode formation regions B provided on both ends of the semiconductor device 13. That is, the first front-surface electrode 53 is disposed further toward the inside in the semiconductor device 13 than both ends.

Referring to FIG. 2, the protective film 54 is provided on the upper surface 52*a* of the third insulating film 52, and has an aperture part 54A that exposes the first front-surface electrode 53.

Referring to FIG. 2, the first rear-surface electrode 55 is provided so as to cover one end 71*b* of the first substrate through electrode 71. The first rear-surface electrode 55 protrudes from the lower surface 45*a* of the second insulating film 45. As shown in FIG. 1, the first rear-surface electrode 55 is an electrode that is connected to the first front-surface electrode 53 that is provided in the semiconductor device 13 disposed below the first rear-surface electrode 55 and, in the case of performing a test of the semiconductor device 10, is an electrode that is not made contact with by a terminal (for example, a probe needle) of an inspection apparatus.

Referring to FIG. 2, the second rear-surface electrode 56 is provided on the lower surface 45*a* of the second insulating film 45, so as to make contact with the one end 85*b* of the second substrate through electrode 85. The second rear-surface electrode 56 is an electrode that is not used for making connection with the other semiconductor devices 13, and is an electrode that does make contact with a terminal of a test apparatus (for example, a probe needle) when a test of the semiconductor device 10 is performed.

The surface area of the surface 56*a* of the second rear-surface electrode 56, that is positioned on the opposite side from the surface that makes contact with the second through electrode 49 is larger than the surface area of the surface 55*a* of the first rear-surface electrode 55 that is positioned on the opposite side from the surface that makes contact with the first through electrode 48.

In this manner, by making the surface area of the surface 56*a* of the second rear-surface electrode 56 larger than the surface area of the surface 55*a* of the first rear-surface electrode 55, it is easy for a probe needle to make contact with the surface 56*a* of the second rear-surface electrode 56.

Figure 4:
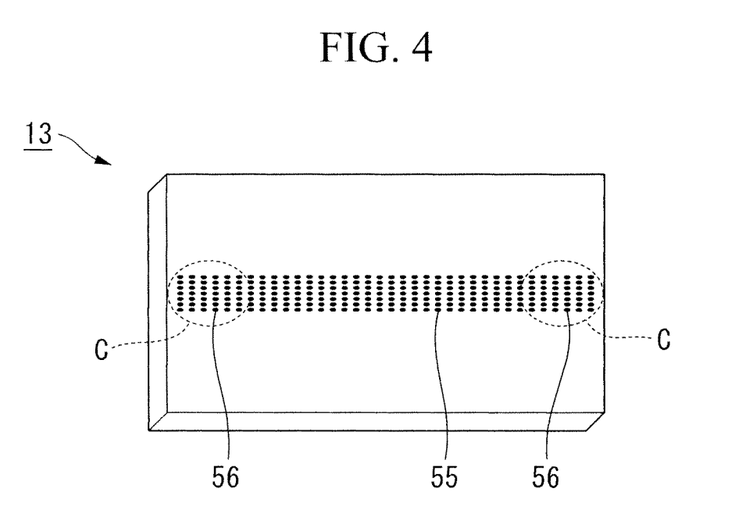
FIG. 4 is a view showing a first surface of each semiconductor chip included in the semiconductor package of FIG. 1.

FIG. 4 is an oblique view showing the front-surface side of the semiconductor device shown in FIG. 2. In FIG. 4, C is the region in which the second rear-surface electrode 56 is formed (hereinafter, the second rear-surface electrode formation region C).

Referring to FIG. 4, the second rear-surface electrode 56 is disposed in the second rear-surface electrode formation region C, at positions on both ends of the semiconductor device 13, so as to sandwich a plurality of first rear-surface electrodes 55.

The semiconductor device of the present embodiment has a first through electrode 48 that has a first front-surface electrode 53 on one end (the upper surface 77*a* of the fourth interconnect pad 77) positioned on the front-surface side of the semiconductor chip 38 and also that has a first rear-surface electrode 55 on the one end (the one end 71*b* of the first substrate through electrode 71) positioned on the rear-surface side of the semiconductor chip 38, and a second through electrode that has a second rear-surface electrode 56 on the one end (the one end 85*b* of the second substrate through electrode 85) of the rear surface of the semiconductor chip 38 and also does not have an electrode on the one end positioned on the front-surface side of the semiconductor chip 38. By virtue of this constitution, when testing the semiconductor chip 38 constituting the semiconductor device 13, a terminal of an inspection apparatus (specifically, for example, a probe needle) is caused to come into contact with the second rear-surface electrode 56 provided on the one end of the second through electrode 49, thereby enabling testing of the semiconductor chip 38 and, when making electrical connections between a plurality of semiconductor devices 13 that are in the stacked condition, it is also possible to make an electrical connection between the semiconductor devices 13, via the first front-surface electrodes 53 and the first rear-surface electrodes 55 that are provided in the first through electrodes 48 and that are not used for testing.

By doing this, it is possible to improve the reliability of the electrical connections between the stacked semiconductor devices 13.

Figure 5:
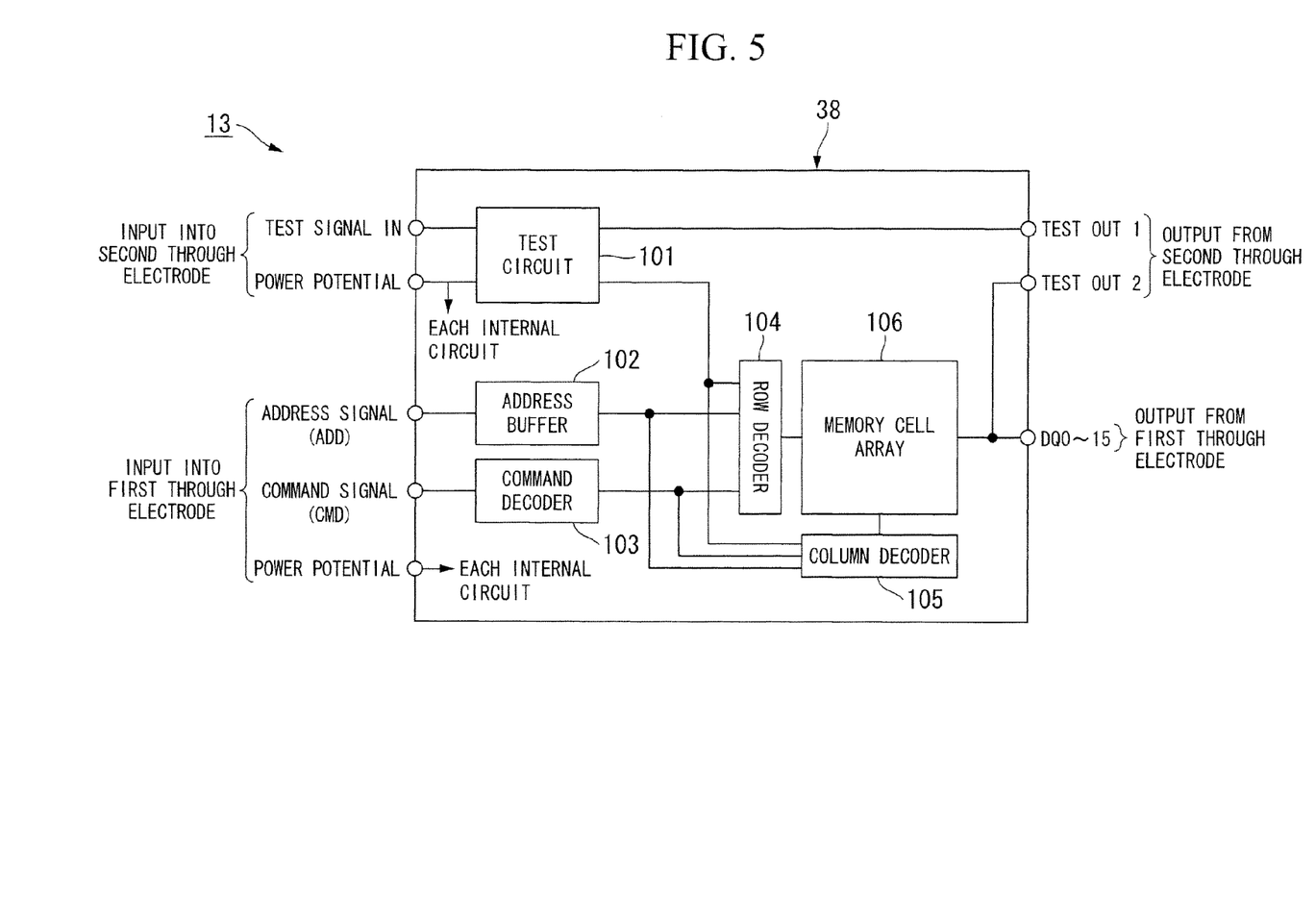
FIG. 5 is a circuit block included in each semiconductor chip included in the semiconductor package of FIG. 1.

FIG. 5 is a schematic representation of the block diagram of a semiconductor chip of the semiconductor device shown in FIG. 2.

Referring to FIG. 5, the semiconductor chip 38 has a test circuit 101, an address buffer 102, a command decoder 103, a row decoder 104, a column decoder 105, and a memory cell array 106.

The test circuit 101 is a circuit for performing a test of the semiconductor chip 38, and is electrically connected to the row decoder 104 and the column decoder 105. A test signal IN and a power supply potential are input to the test circuit 101 via the second through electrodes 49 shown in FIG. 2.

The address buffer 102 is electrically connected to the row decoder 104 and the column decoder 105. The address buffer 102 generates an internal row address from the row address included within the address signal input from the first through electrode 48 shown in FIG. 2, and sends this internal row address to the row decoder 104 and the column decoder 105.

The command decoder 103 is electrically connected to the row decoder 104 and the column decoder 105. The command decoder 103 decodes the command signal input from the first through electrode 48 shown in FIG. 2 and sends the decoded command signal to the row decoder 104 and the column decoder 105, so as to control the row decoder 104 and the column decoder 105.

The row decoder 104 decodes the internal row address input from the address buffer 102 and, by the decoded signal, selects a word line provided in the memory cell array 106.

The column decoder 105 decodes the internal row address input from the address buffer 102 and, by the decoded signal, selects a hit line (not shown) provided in the memory cell array 106.

The memory cell array 106 has a plurality of word lines (not shown), a plurality of bit lines (not shown) that intersection with the word lines, and a plurality of memory cells (not shown). The word lines are electrically connected to the row decoder 104. The bit lines are electrically connected to the column decoder 105.

Referring to FIG. 5, the operation of the semiconductor device 13 will now be described. The semiconductor device 13 has a normal operating mode and a test mode.

In the normal operating mode, read operations and write operations are performed by the address signal (ADD), the command signal (CMD), the power supply potential, and the DQ signal that are input and output via the first through electrodes 48 shown in FIG. 2.

In contrast, in a test mode, test operation is performed by the test signal IN, the test signal OUT, and the power supply potential that are input and output from the second through electrodes 49 shown in FIG. 2. That is, the second through electrodes 49 are connected to the test circuit 101 and transmit signals used in the test mode, but do not transmit signals when used in the normal operating mode.

There are a plurality of test modes, and in a test mode related to input and output of data, such as reading and writing, the test circuit 101, based on the test signal IN, controls the test operation via the test signal OUT2 path, and in other test modes (for example, power supply or clock tests), the test circuit 101 controls the test operation via the test signal OUT1 path.

The number of test signal IN and test signal OUT is not restricted in this manner, and can be any number, in accordance with the testing application. Thus, the number of second through electrodes 49 can also be set in accordance with the number of test signals.

Figure 6:
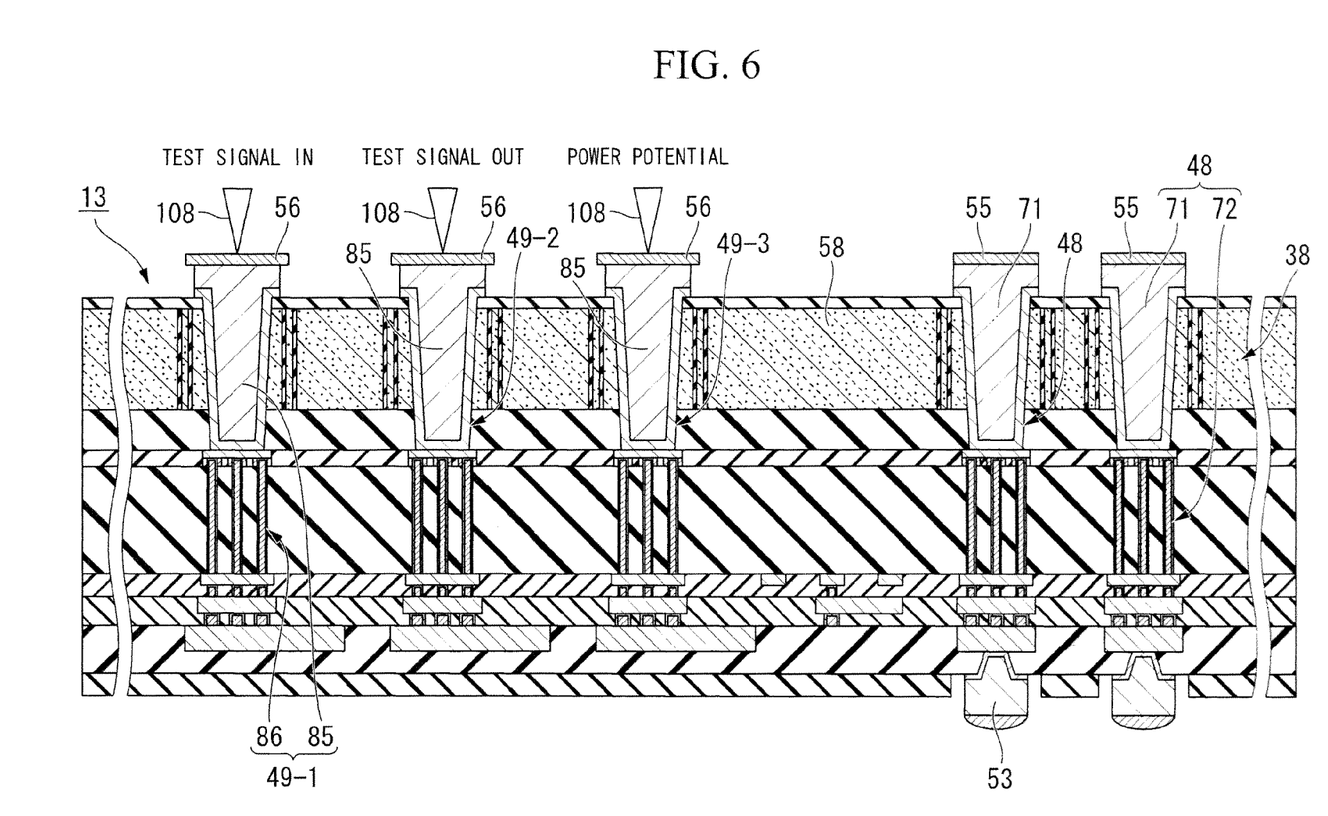
FIG. 6 is a fragmentary cross sectional elevation view of a semiconductor chip included in the semiconductor package of FIG. 1 when conducting a test before stacking the semiconductor chip over a package substrate.

FIG. 6 is a schematic cross-sectional view of the condition in a semiconductor device test performed before stacking of the semiconductor devices onto the package board. In FIG. 6, constituent elements that are the same as in the semiconductor device 13 shown in FIG. 2 are assigned the same reference numerals, and the second through electrodes 49 are, as a convenience, labeled as the second through electrodes 49-1, 49-2, and 49-3.

Referring to FIG. 6, a brief description will be made of the test of the semiconductor chips 38 constituting the semiconductor devices 13 before they are stacked onto the package board 11 shown in FIG. 1. This test is performed in the condition in which the semiconductor substrates 58 have not been separated into individual pieces, that is, in the wafer condition.

Specifically, probe needles 108 provided by a prober (not shown), which is an inspection apparatus, are brought into contact with the second rear-surface electrodes 56 so as to perform a test of the semiconductor chip 38.

As described above with regard to FIG. 5, because the second through electrode 49-1 that receives the test signal IN is electrically connected to the test circuit 101, the test signal OUT is output from a different second through electrode 49-2, depending upon the test mode.

In this manner, by bringing the probe needles 108 into contact with the second rear-surface electrodes 56 provided on the second through electrodes 49-1, 49-2, and 49-3 and performing a test of the semiconductor chip 38, there is no contacting (connection) of the probe needles 108 with the first rear-surface electrode 55.

By doing this, because damage imparted by the probe needles 108 to the first rear-surface electrodes 55 that are connected to the other semiconductor devices 13 is eliminated, it is possible to avoid bad electrical connections between semiconductor devices 13 caused by damage done by the probe needles 108 when a plurality of semiconductor devices 13 are mounted on the package board 11.

There are a number of methods of manufacturing the semiconductor device 13 having the first and second substrate through electrodes 71, 85. There is, for example, the via-last method (the method of forming the substrate through electrodes on the semiconductor substrate 58 after the upstream process steps of forming the electrical circuitry and interconnects and the like on the front surface 58a side of the semiconductor substrate 58).

In the case of forming the first and second substrate through electrodes 71, 85 by using the above-noted via-last method, it is necessary to perform an electrical test after the upstream process steps.

Figure 7:
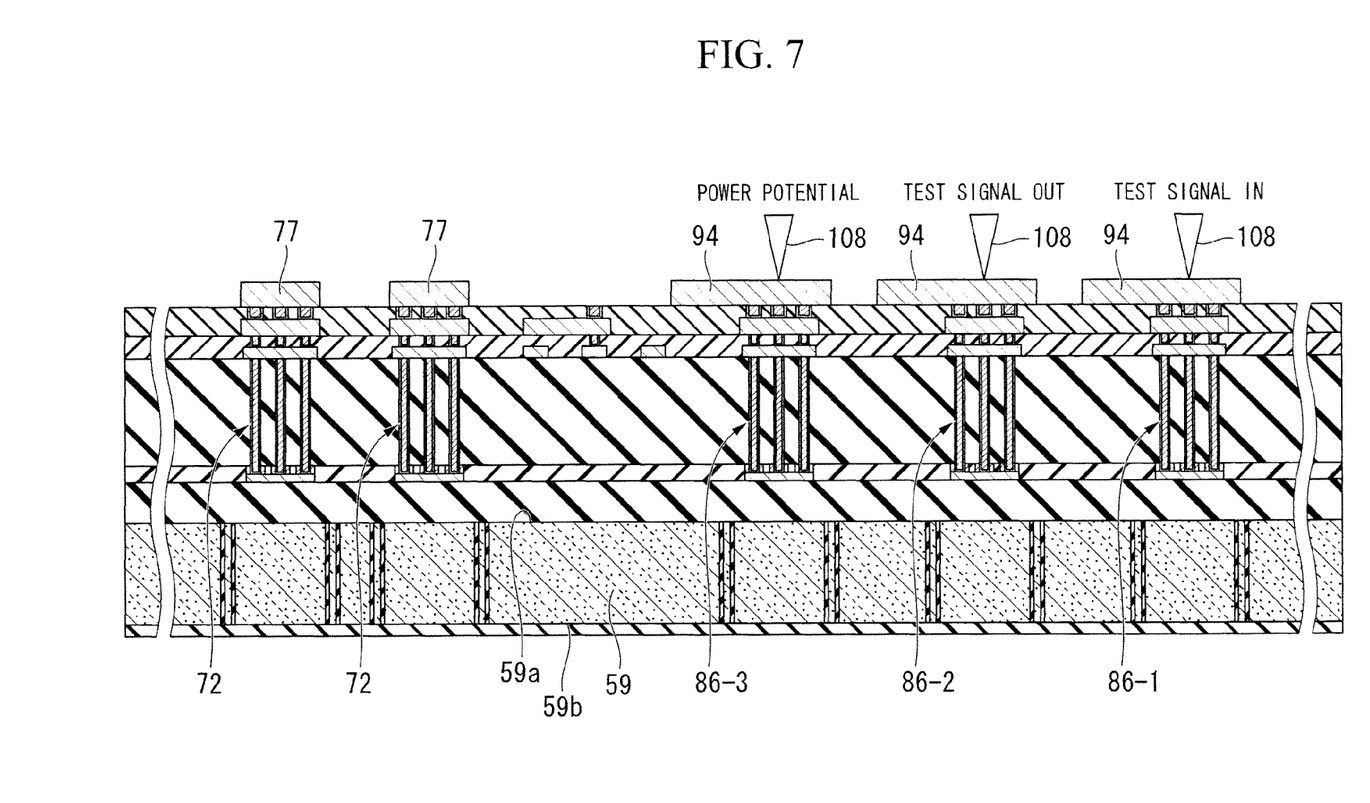
FIG. 7 is a fragmentary cross sectional elevation view of a semiconductor chip included in the semiconductor package of FIG. 1 when conducting a test in case that through electrodes are formed in a via last test.

FIG. 7 is a schematic cross-sectional view of the condition of the electrical test in the case of forming the first and second substrate through electrodes by the via-last method. In FIG. 7, constituent elements that are the same as in the structure shown in FIG. 6 are assigned the same reference numerals and, as a convenience, the second interconnect structures 86 shown in FIG. 6 are labeled as the second interconnect structures 86-1, 86-2, and 86-3.

As shown in FIG. 7, in the case of forming the first and second substrate through electrodes 71 and 85 by the via-last method, an electrical test is performed by using the first interconnect pads 94 provided on each of the second interconnect structures 86-1, 86-2, and 86-3 and disposed on the uppermost layer as P/W pads after the upstream process steps.

In the case of FIG. 7, by bringing a probe needle 108 into contact with the fourth interconnect pad 94 that constitutes the second interconnect structure 86-1 the test signal IN is input to the second interconnect structure 86-1, by bringing a probe needle 108 into contact with the fourth interconnect pad 94 that constitutes the second interconnect structure 86-2, the test signal OUT is input to the second interconnect structure 86-2, and by bringing a probe needle 108 into contact with the fourth interconnect pad 94 that constitutes the second interconnect structure 86-3, the power supply potential is input to the second interconnect structure 86-3.

Because, by performing an electrical test by bringing the probe needles 108 into contact with the fourth interconnect pads 94 that constitute the second interconnect structures 86-1 to 86-3, there is no damage imparted to the first rear-surface electrodes 55 and first front-surface electrodes 53 used to connect to the other semiconductor devices 13, it is possible to avoid bad electrical connections between semiconductor devices 13 when a plurality of semiconductor devices 13 are stacked and mounted onto the package board 11.

As used herein, the following directional terms "forward, rearward, above, downward, vertical, horizontal, below, and transverse" as well as any other similar directional terms refer to those directions of an apparatus equipped with the present invention. Accordingly, these terms, as utilized to describe the present invention should be interpreted relative to an apparatus equipped with the present invention.

The term "configured" is used to describe a component, section or part of a device includes hardware and/or software that is constructed and/or programmed to carry out the desired function.

Furthermore, the particular features, structures, or characteristics may be combined in any suitable manner in one or more embodiments.

The terms of degree such as "substantially," "about," and "approximately" as used herein mean a reasonable amount of deviation of the modified term such that the end result is not significantly changed. For example, these terms can be construed as including a deviation of at least ±5 percents of the modified term if this deviation would not negate the meaning of the word it modifies.

It is apparent that the present invention is not limited to the above embodiments, but may be modified and changed without departing from the scope and spirit of the invention.

What is claimed is:

1. A semiconductor device comprising:
a semiconductor chip including first and second surfaces;
a first through electrode that extends through the semiconductor chip;
a first surface electrode positioned on the first surface of the semiconductor chip, the first surface electrode being coupled to a first end of the first through electrode;
a second surface electrode positioned on the second surface of the semiconductor chip, the second surface electrode being coupled to a second end of the first through electrode;
a second through electrode that extends through the semiconductor chip, the second through electrode including third and fourth ends; and
a third surface electrode positioned on the second surface of the semiconductor chip, the third surface electrode being coupled to the fourth end of the second through electrode,
wherein the semiconductor device is free of any surface electrode on the first surface of the semiconductor chip coupled to the third end of the second through electrode.

2. The semiconductor device according to claim 1, further comprising:
an insulator that covers the third end of the second through electrode.

3. The semiconductor device according to claim 1, further comprising:
an insulating film which covers the first surface of the semiconductor chip, the insulating film including a first opening through which the first surface electrode is coupled to the first end of the first through electrode, the insulating film covering the third end of the second through electrode.

4. The semiconductor device according to claim 1, wherein the semiconductor chip comprises:
a semiconductor substrate; and
a multilevel interconnect structure over the semiconductor substrate,
wherein the first through electrode comprises a first portion penetrating the semiconductor substrate, and a second portion extending through the multilevel interconnect structure and being connected to the first portion, and
wherein the second through electrode comprises a third portion penetrating the semiconductor substrate, and a fourth portion extending through the multilevel interconnect structure and being connected to the third portion.

5. The semiconductor device according to claim 4, wherein the first and third portions comprise copper, and
the second and fourth portions are made of a conductor which is different from copper.

6. The semiconductor device according to claim 4, wherein the semiconductor chip further comprises:
a test circuit electrically coupled to the second through electrode.

7. The semiconductor device according to claim 1, wherein the third surface electrode is greater in surface area than the second surface electrode.

8. The semiconductor device according to claim 1, wherein the semiconductor chip includes a normal operation mode and a test mode, and the semiconductor chip is configured to transfer signals through the second through electrode in the test mode, and the semiconductor chip is configured not to transfer signals through the second through electrode in the normal operation mode.

9. A device comprising:
a semiconductor substrate including first and second surfaces;
a plurality of first surface electrodes formed over the first surface of the semiconductor substrate;
second and third surface electrodes formed over the second surface of the semiconductor substrate;
a first substrate through electrode penetrating through the semiconductor substrate from the first surface to the second surface, the first substrate through electrode being electrically coupled to one of the first surface electrodes at one end thereof and electrically coupled to the second surface electrode at an other end thereof; and
a second substrate through electrode penetrating through the semiconductor substrate from the first surface to the second surface, the second substrate through electrode being electrically coupled to the third surface electrode at one end thereof, an other end of the second substrate through electrode being electrically disconnected from any one of the first surface electrodes.

10. The device as clamed in claim 9, further comprising:
a first wiring layer formed over the first surface of the semiconductor substrate;
first and second interconnect pads each formed as the first wiring layer, the first interconnect pad being coupled between the one end of the first substrate through electrode and the one of the first surface electrodes, the second interconnect pad being coupled to the other end of the second substrate through electrode; and
a first insulating layer formed on the first wiring layer, including a first hole portion that is positioned above the first interconnect pad and covering the second interconnect pad.

11. The device as claimed in claim 10, wherein a part of the one of the first surface electrodes is formed in the first hole portion.

12. The device as claimed in claim 9, further comprising:
a plurality of fourth surface electrodes formed over the second surface of the semiconductor substrate; and
a plurality of third substrate through electrodes each penetrating through the semiconductor substrate from the first surface to the second surface, each of the third substrate through electrodes being electrically coupled to an associated one of the rest of the first surface electrodes at one end thereof and electrically coupled to an associated one of the fourth surface electrodes at an other end thereof.

13. The device as clamed in claim 12, further comprising:
a first wiring layer formed over the first surface of the semiconductor substrate;
a plurality of first interconnect pads each formed as the first wiring layer, each of the first interconnect pads being coupled between an associated one of the first and third substrate through electrodes and an associated one of the first surface electrodes;
a second interconnect pad formed as the first wiring layer, the second interconnect pad being coupled to the other end of the second substrate through electrode; and
a first insulating layer formed on the first wiring layer, including a plurality of first hole portions each of which is positioned above an associated one of the first interconnect pads and covering the second interconnect pad.

14. The device as claimed in claim 13, wherein a part of each of the first surface electrodes is formed in an associated one of the first hole portions.

15. The device as claimed in claim 13, wherein a part of each of the first surface electrodes is formed in an associated one of the first hole portions.

16. The device as claimed in claim 12, further comprising:
a plurality of fifth surface electrodes formed over the second surface of the semiconductor substrate; and
a plurality of fourth substrate through electrodes each penetrating through the semiconductor substrate from the first surface to the second surface, each of the fourth substrate through electrodes being electrically coupled to an associated one of the fifth surface electrodes at one end thereof, an other end of each of the fourth substrate through electrodes being electrically disconnected from any one of the first surface electrodes.

17. The device as darned in claim 16, further comprising:
a first wiring layer formed over the first surface of the semiconductor substrate;
a plurality of first interconnect pads each formed as the first wiring layer, each of the first interconnect pads being coupled between an associated one of the first and third substrate through electrodes and an associated one of the first surface electrodes,
a plurality of second interconnect pads each formed as the first wiring layer, each of the second interconnect pads being coupled to the other end of an associated one of the second and fourth substrate through electrodes; and
a first insulating layer formed on the first wiring layer, including a plurality of first hole portions each of which is positioned above an associated one of the first interconnect pads and covering the second interconnect pads.

18. The device as claimed in claim 16, wherein the semiconductor substrate includes first, second and third regions that are arranged in line, the first region is between the second and third regions, the first and third substrate through electrodes are disposed in the first region, one or ones of the second and fourth substrate through electrodes are disposed in the second region, and the rest of the second and fourth substrate through electrodes are disposed in the third region.

19. The device as claimed in claim 18, wherein the semiconductor substrate includes first and second edges facing to each other, the second region is between the first region and the first edge, and the third region is between the first region and the second edge.

20. The device as claimed in claim 9, wherein the third surface electrode is greater in surface area than the second surface electrode.

* * * * *